United States Patent

Etzbach et al.

[11] Patent Number: 5,922,481
[45] Date of Patent: Jul. 13, 1999

[54] ELECTROLUMINESCENT ARRANGEMENT

[75] Inventors: Karl-Heinz Etzbach, Frankenthal; Frank Meyer, Ludwigshafen; Wolfgang Paulus, Weisenheim; Hans-Werner Schmidt, Bayreuth, all of Germany

[73] Assignee: BASF Aktiengesellschaft, Ludwigshafen, Germany

[21] Appl. No.: 08/860,718

[22] PCT Filed: Jan. 12, 1996

[86] PCT No.: PCT/EP96/00113

§ 371 Date: Jul. 14, 1997

§ 102(e) Date: Jul. 14, 1997

[87] PCT Pub. No.: WO96/22005

PCT Pub. Date: Jul. 18, 1996

[30] Foreign Application Priority Data

Jan. 13, 1995 [DE] Germany .......................... 195 00 912

[51] Int. Cl.$^6$ ..................................................... H05B 33/14
[52] U.S. Cl. ...................... 428/690; 428/411.1; 428/500; 428/523; 428/917; 313/504; 313/506; 427/66; 427/496; 427/508
[58] Field of Search ................................ 428/411.1, 500, 428/523, 690, 917; 313/503, 504, 506; 427/66, 496, 508, 551, 553

[56] References Cited

U.S. PATENT DOCUMENTS

| | | | |
|---|---|---|---|
| 4,539,507 | 9/1985 | Vanslyke et al. | 313/504 |
| 4,720,432 | 1/1988 | Vanslyke et al. | 428/457 |
| 4,769,292 | 9/1988 | Tang et al. | 428/690 |
| 5,514,878 | 5/1996 | Holmes et al. | 257/40 |
| 5,518,824 | 5/1996 | Funhoff et al. | 428/690 |
| 5,652,067 | 7/1997 | Ito et al. | 428/690 |
| 5,653,914 | 8/1997 | Holmes et al. | 252/301.16 |
| 5,665,857 | 9/1997 | Shi | 528/373 |
| 5,710,197 | 1/1998 | Fischer et al. | 524/82 |

FOREIGN PATENT DOCUMENTS

| | | |
|---|---|---|
| A 0 387 715 | 9/1990 | European Pat. Off. . |
| 0 390 551 A2 | 10/1990 | European Pat. Off. . |
| A 0 443 861 | 8/1991 | European Pat. Off. . |
| A 0 449 125 | 10/1991 | European Pat. Off. . |
| A 0 637 899 | 2/1995 | European Pat. Off. . |
| 0 692 517 A1 | 1/1996 | European Pat. Off. . |
| 132109 | 1/1992 | Japan . |
| WO A 88 04467 | 6/1988 | WIPO . |
| WO A 90 13148 | 11/1990 | WIPO . |
| WO 92 03490 | 3/1992 | WIPO . |
| WO 92 03491 | 3/1992 | WIPO . |
| WO 94/15441 | 7/1994 | WIPO . |
| WO 95/07955 | 3/1995 | WIPO . |

*Primary Examiner*—Marie Yamnitzky
*Attorney, Agent, or Firm*—Oblon, Spivak, McClelland, Maier & Neustadt, P.C.

[57] ABSTRACT

An electroluminescent arrangement contains one or more organic layers, at least one of which is obtained by thermal or radiation-induced crosslinking and contains at least one charge-transporting compound which can carry crosslinkable groups per layer, one of the layers being completely or partially composed of a crosslinkable fluorescent compound which emits fluorescent light in the wavelength range from 400 to 800 nm.

12 Claims, 1 Drawing Sheet

ELECTROLUMINESCENT ARRANGEMENT

BACKGROUND OF THE INVENTION

1. Field of the Invention

The present invention relates to an electroluminescent arrangement containing one or more organic layers, at least one of which obtained by thermal-or radiation-induced crosslinking and contains at least one charge-transporting compound which can carry crosslinkable groups per layer, wherein one of the layers is completely or partially composed of a cross-linkable fluorescent compound, and the compound emits fluorescent light in the wavelength range from 400 to 800 nm.

2. Description of the Background

On application of an electrical voltage, an electroluminescent (EL) arrangement emits light with a flow of current. Such arrangement have long been known in industry under the name light emitting diodes (LEDs). The emission of light occurs when positive charges (holes) and negative charges (electrons) combine with emission of light.

The LEDs usually used in industry all consist predominantly of inorganic semiconductor materials. However, EL arrangements whose essential components are organic materials have been known for a few years.

These organic EL arrangements contain, as a rule, one or more layers of organic charge-transporting compounds. The structural principle is shown in the figure. The numbers 1 to 10 have the following meanings:

1 substrate
2 base electrode
3 hole-injecting layer
4 hole-transporting layer
5 emitter layer
6 electron-transporting layer
7 electron-injecting layer
8 top electrode
9 contacts
10 encapsulation is structure represents the most general case and can be simplified by omitting individual layers so that a layer performs a plurality of functions. In the simplest case, an EL arrangement consists of two electrodes between which an organic layer which performs all functions, including that of the emission of light, is present. Such systems based on poly-[p-phenylenevinyls] are described, for example, in WO 9013148.

The literature describes a large number of organic compounds which transport charges (holes and/or electrons). Low molecular weight substances which are applied, for example, by vapor deposition under greatly reduced pressure are predominantly used. For example, the publications EP-A-387715 and U.S. Pat. Nos. 4,53,9507, 4,720,432 and 4,769,292 give a good overview of the classes of substances and their use. In principle, it is possible to use all substances which are known in electrophotography to be photoconductors.

The common feature of all these EL arrangements which are based on low molecular weight compounds is that they do not have a sufficient operating life. During operation, the organic light emitting diodes become very hot (>100° C.), and this leads to a change in the layers including their destruction, so that reduced performance or complete loss of function is encountered.

These problems were set to occur to a lesser extent when polymers were used in EL arrangements. However, layers which contain polymer have not been widely described. Thus, Japanese Preliminary Published Application JP 4028197 describes, for example, an EL arrangement which contains polyvinylcarbazole as a component of the emitter layer. Soluble polymers, such as polyvinylcarbazole, are applied by casting or spin-coating using dilute solutions. The disadvantage of this process is that a plurality of layers cannot be applied in this way since the solvent for the second layer superficially dissolves or at least superficially swells the first layer. This then leads to mixing of the two layers at the interface and hence to a reduction in efficiency. These problems are described in detail in U.S. Pat. No. 4,539,507.

It should also be noted that the thermal stability of polymer layers are limited not only chemically (decomposition) but also physically by their glass transition temperature or melting point.

Further examples of the use of polymers in EL arrangements are poly[p-phenylenevinyls] (PPV) and polyimides. The use of PPV in EL arrangements is described in EP-A-443861, and in WO-A-9013148, 9203490 and 9203491. The high thermal stability of PPV, which is also insoluble, may be mentioned as an advantage.

Polyimide layers are obtained by vapor deposition of corresponding comonomers under greatly reduced pressure and subsequent thermal formation of the polyimide (cf. EP-A-449125). These polymers are likewise insoluble.

For applications in the EL sector (in particular displays), this insolubility is considered a disadvantage because it excludes the possibility of photostructuring. Moreover, the thermal treatment of the substrates, which treatment is required for the preparation of the polymers, limits the choice to substrates which are stable at high temperatures, for example glass.

OBJECTS OF THE INVENTION

It is an object of the present invention to avoid the described disadvantages of the prior art.

We have found that this object is achieved by the electroluminescent arrangements defined at the outset.

DETAILED DESCRIPTION OF THE INVENTION

Figure 1:
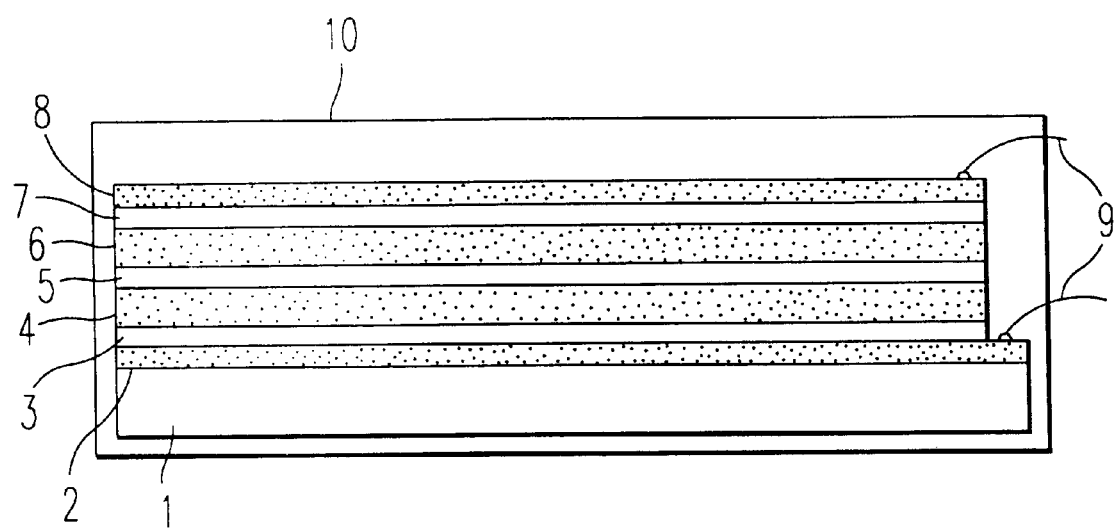

The structure of these EL arrangements corresponds in principle to the scheme shown in FIG. 1, where, as stated above, the number of organic layers can be reduced if individual layers perform a plurality of functions.

This combination of a plurality of functions in one layer relates in particular to the layers 3 to 7. In the structure of the EL arrangement, for example, the electron conductor layer and the electron-injecting layer can be dispensed with. The EL arrangement would then consist of, for example, the layers 3 to 5 in addition to the electrodes and the substrate.

The layers preferably have a thickness of from 10 nm to 10 $\mu$m.

Below, charge transport compounds are understood as meaning all compounds which transport charges (holes and/or electrons) in some manner. These also expressly include-those compounds which are components of the emitter layer, ie. photoluminescent materials, such as fluorescent dyes.

We have found that the disadvantages described can be avoided in the novel EL arrangements. The structure of these EL arrangements corresponds in principle to the diagram shown in the figure, where, as stated above, the number of organic layers can be reduced if individual layers perform a plurality of functions.

In the novel layer structure of the EL arrangement, the components of the individual layers are crosslinked thermally or, particularly preferably, by means of actinic radiation (for example UV light, visible light, electron beams or X-rays). First, a suitable substrate is coated. Examples of suitable substrates are glasses and films which are provided with a conductive coating and are mechanically stable. The substrate and the electrodes should absorb as little as possible at the wavelength of the emitted light. As a rule, an appropriate solution which contains the charge-transporting compounds in addition to further, optional components, such as binders, reactive diluents, crosslinking agents and thermal initiators or photoinitiators, is applied to a substrate by spin-coating or by means of a knife coater, and, after any drying, the resulting film is crosslinked thermally or, particularly preferably, by means of actinic radiation. The advantage of the latter embodiment is that the substrate is scarcely subjected to any thermal stress. In any case, depending on the planned structure, the next layer can be applied immediately after crosslinking. As a result of the formation of an insoluble polymer network in the layer just treated, the freshly applied layer does not mix with the crosslinked layer. In the case of radiation-induced crosslinking, the layer or layers can of course also be structured by imagewise exposure by known methods, and unexposed parts can be removed by washing out. Systems which are based on crosslinking and can be photostructured are known in industry (printing plates, photoresists).

It is also possible to combine crosslinked layers with uncrosslinked layers, which are obtained in a known manner, for example by vapor deposition or knife coating and, if required, then fixed.

According to the invention, all compounds which in any way transport charges (holes and/or electrons) can be used as charge-transporting compounds in the layers. As stated above, said compounds expressly include those compounds which are components of the emitter layer, ie. are photoluminescent materials, such as fluorescent dyes. Compounds which carry groups capable of anionic, cationic or, preferably, free radical polymerization are particularly suitable. Charge-transporting compounds which carry groups capable of photocycloaddition are also preferred.

Possible parent compounds of the charge-transporting compounds are the following: tertiary aromatic amines, oxadiazoles, thiadiazoles, benzoxazoles, benzotriazoles, naphthalimides, bisstyryls, coumarins, benzofurans, dibenzanthrones, phthalocyanines, fused aromatic systems, such as perylenes, pyrenes, or coronenes, or polyene compounds which preferably additionally carry groups capable of cationic or free radical polymerization or groups capable of photocycloaddition. Compounds of this type which also have fluorescent properties in addition to charge-transporting properties are preferred. Among these, compounds from the class consisting of the perylenes, naphthalimides, dibenzanthrones, pyrenes, benzotriazoles, oxadiazoles, bisstyryls, benzoxazoles, coumarins or benzofurans and violanthrones and isoviolanthrones are noteworthy. Particularly preferred among these are compounds from the class consisting of the perylenes, naphthalimides, violanthrones and isoviolanthrones. Such compounds are preferably incorporated in the layers 3, 4, 6 and 7 or in combinations thereof.

Particularly suitable compounds which according to the invention emit light, ie. fluoresce, and which emit light having a wavelength of from 400 to 800 nm are fluorescent compounds which carry groups capable of anionic, cationic or, preferably, free radical polymerization. Fluorescent compounds which can be crosslinked thermally or by photocycloaddition are also suitable. The crosslinkable fluorescent compounds as such or in combination with other crosslinkable compounds may form one or more layers of the electroluminescent arrangement, preferably including layer 5. The polymerization (crosslinking) may be carried out with or without additives, such as reactive diluents, crosslinking agents or binders.

The perylene compounds are preferably derived from 3,4,9,10-perylenecarboxylic acids or derivatives thereof which may be addition-ally be substituted in the 1-, 6-, 7- or 12-position by chlorine, bromine, $C_1$–$C_6$-alkoxy or phenoxy. Naphthalimide compounds carry substituents and/or crosslinkable groups, in particular on the imide nitrogen and in positions 4 and 5. Violanthrone and isoviolanthrone compounds carry the crosslinking groups, preferably bonded via oxygen, in positions 16 and 17 or 6 and 15.

Benzotriazoles are preferably of the general formula

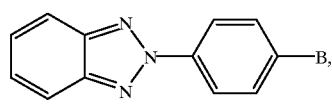

where
  B is a crosslinkable group bonded via oxygen or nitrogen, and in which the benzo and/or phenylene radical may furthermore be substituted by chlorine, bromine, alkyl or alkoxy or by crosslinkable groups.

Examples of individual fluorescent compounds are:

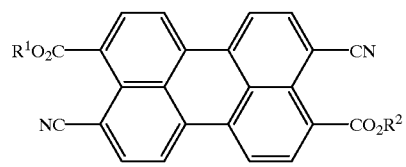

| Compound | $R^1$ | $R^2$ |
|---|---|---|
| 1 | (CH$_2$)$_2$—O—C(=O)—CH=CH$_2$ | $C_4H_9$ |

-continued
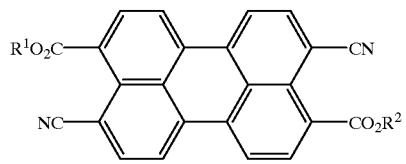
| Compound | R¹ | R² |
|---|---|---|
| 2 | (CH₂)₂—O—C(=O)—CH=CH₂ | CH₂—CH(C₄H₉)(C₂H₅) |
| 3 | (CH₂)₂—O—C(=O)—CH=CH₂ | (CH₂)₆—O—C(=O)—CH=CH₂ |
| 4 | (CH₂)₆—O—C(=O)—C(CH₃)=CH₂ | (CH₂)₆—O—C(=O)—C(CH₃)=CH₂ |
| 5 | (CH₂)₆—O—CH=CH₂ | (CH₂)₆—O—CH=CH₂ |
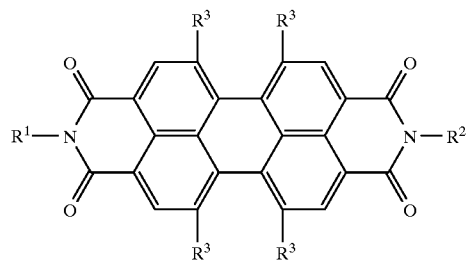
| Compound | R¹ | R² | R³ |
|---|---|---|---|
| 6 | (CH₂)₆—O—C(=O)—CH=CH₂ | CH₂—CH(C₄H₉)(C₂H₅) | H |
| 7 | (CH₂)₆—O—C(=O)—CH=CH₂ | (CH₂)₆—O—C(=O)—CH=CH₂ | H |
| 8 | (CH₂)₆—O—C(=O)—CH=CH₂ | (CH₂)₆—O—C(=O)—CH=CH₂ | Cl |
| 9 | (CH₂)₆—O—C(=O)—CH=CH₂ | (CH₂)₆—O—C(=O)—CH=CH₂ | O—C₆H₅ |
| 10 | (CH₂)₆—O—C(=O)—CH=CH₂ | (CH₂)₆—O—C(=O)—CH=CH₂ | Cl |

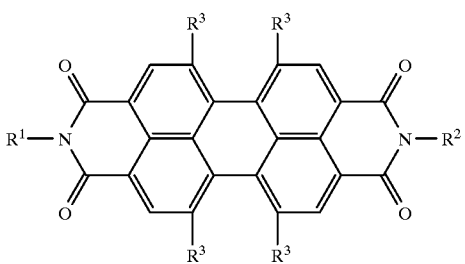

| Compound | R¹ | R² | R³ |
|---|---|---|---|
| 11 | (CH$_2$)$_6$—O—CO—CH=CH$_2$ | (CH$_2$)$_6$—O—CO—CH=CH$_2$ | —O—C$_6$H$_5$ |
| 12 | (CH$_2$)$_2$—O—CH=CH$_2$ | (CH$_2$)$_2$—O—CH=CH$_2$ | Cl |
| 13 | (CH$_2$)$_2$—O—CH=CH$_2$ | (CH$_2$)$_2$—O—CH=CH$_2$ | —O—C$_6$H$_5$ |
| 14 | CH$_3$—C$_6$H$_4$—O—(CH$_2$)$_2$—O—CO—CH=CH$_2$ | CH$_3$—C$_6$H$_4$—O—(CH$_2$)$_2$—O—CO—CH=CH$_2$ | Cl |
| 15 | CH$_3$—C$_6$H$_4$—O—(CH$_2$)$_2$—O—CO—CH=CH$_2$ | CH$_3$—C$_6$H$_4$—O—(CH$_2$)$_2$—O—CO—CH=CH$_2$ | —O—C$_6$H$_5$ |
| 16 | (CH$_2$)$_6$—O—CO—CH=CH—C$_6$H$_5$ | (CH$_2$)$_6$—O—CO—CH=CH—C$_6$H$_5$ | —O—C$_6$H$_5$ |
| 17 | (CH$_2$)$_7$—CH(—O—)CH$_2$ (epoxide) | (CH$_2$)$_7$—CH(—O—)CH$_2$ (epoxide) | —O—C$_6$H$_5$ |

18
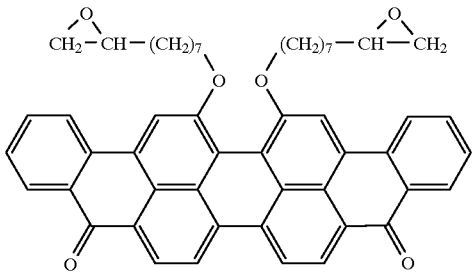

-continued
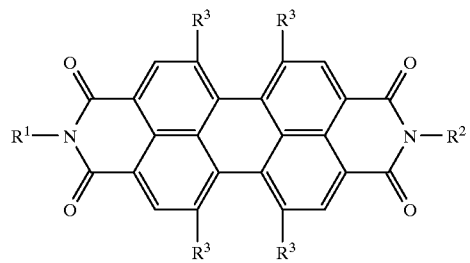
| Compound | R¹ | R² | R³ |
|---|---|---|---|
| 19 | | (perylene structure with both R positions bearing $-O-(CH_2)_4-O-CO-CH=CH_2$ acrylate groups) | |
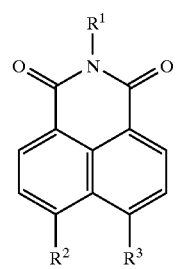
| Compound | R¹ | R² | R³ |
|---|---|---|---|
| 20 | $CH_2-CH(C_2H_5)(C_4H_9)$ | $O-(CH_2)_2-O-CO-C(CH_3)=CH_2$ | $O-(CH_2)_2-O-CO-C(CH_3)=CH_2$ |
| 21 | $CH_2-CH(C_2H_5)(C_4H_9)$ | $O-(CH_2)_4-O-CH=CH_2$ | $O-(CH_2)_4-O-CH=CH_2$ |
| 22 | $CH_2-CH(C_2H_5)(C_4H_9)$ | $-O-(CH_2)_7-CH(-O-)CH_2$ | $-O-(CH_2)_7-CH(-O-)CH_2$ |

-continued
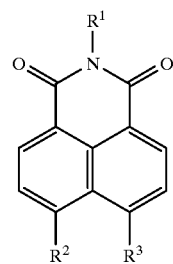
| Compound | R¹ | R² | R³ |
|---|---|---|---|
| 23 | CH₂—CH(C₂H₅)(C₄H₉) | H | O—(CH₂)₆—O—CO—CH=CH₂ |
| 24 | (CH₂)₆—O—CO—CH=CH₂ | H | O—(CH₂)₆—O—CO—CH=CH₂ |
| 25 | (CH₂)₆—O—CO—CH=CH₂ | H | NH—CO—(CH₂)₁₁—O—CO—CH=CH₂ |
| 26 | (CH₂)₆—O—CO—CH=CH₂ | O—(CH₂)₆—O—CO—CH=CH₂ | O—(CH₂)₆—O—CO—CH=CH₂ |
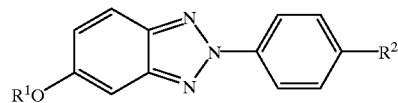
| Compound | R¹ | R² |
|---|---|---|
| 27 | OHC—C₆H₄—O—(CH₂)₆—O—CO—CH=CH₂ | N(CH₃)(C₈H₁₇) |
| 28 | (CH₂)₂—O—CO—C(CH₃)=CH₂ | N(CH₃)(C₈H₁₇) |
| 29 | (CH₂)₂—O—CO—C(CH₃)=CH₂ | N(C₂H₅)((CH₂)₂—O—CO—C(CH₃)=CH₂) |

-continued

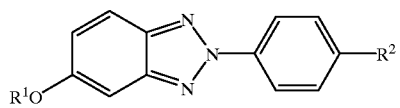

| Compound | R¹ | R² |
|---|---|---|
| 30 | 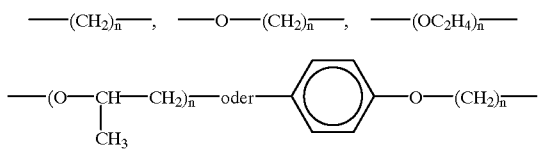 | 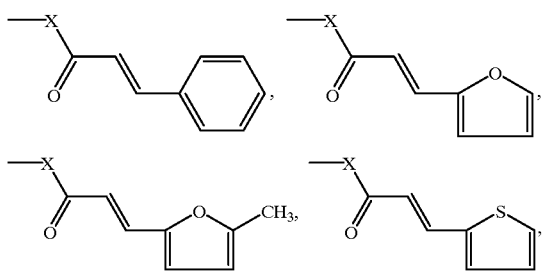 |

Groups capable of free radical polymerization are those in which the polymerization is initiated by free radicals. Examples of such groups are in particular vinyl compounds, including particularly vinylcarbonyl compounds, such as acrylates, methacrylates, or maleic acid derivatives.

Groups capable of cationic polymerization are understood as meaning groups which react with protic acids or Lewis acids with formation of polymers. Examples of such compounds are vinyl ethers and epoxides.

Compounds capable of anionic polymerization are, for example, cyanoacrylates, methacrylates and styrene.

The groups crosslinkable by a free radical, anionic or cationic method or the groups capable of photocycloaddition are preferably bonded to the fluorescent compounds via spacers.

Preferred spacers are groups of the formula

—(CH$_2$)$_{\overline{n}}$—,    —O—(CH$_2$)$_{\overline{n}}$—,    —(OC$_2$H$_4$)$_{\overline{n}}$—

—(O—CH(CH$_3$)—CH$_2$)$_{\overline{n}}$—oder—⟨phenyl⟩—O—(CH$_2$)$_{\overline{n}}$— where n is from 1 to 12.

Of course, one or more groups capable of anionic, cationic or, preferably, free radical polymerization may be bonded to a fluorescent compound. The use of more than one of said groups is preferred since this facilitates network formation.

Pendent groups capable of photocycloaddition are also preferred as substituents for the novel fluorescent compounds. Examples of such pendent groups are:

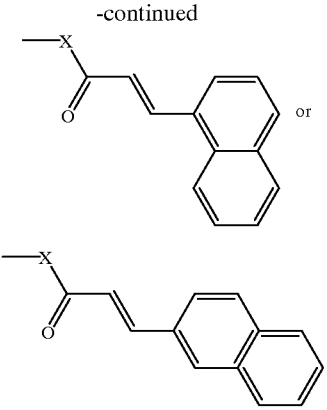

where X is O or NR and the radicals may be further substituted, for example by methyl or methoxy, and R is hydrogen or C$_1$–C$_6$alkyl, preferably methyl or ethyl.

Instead of identical substituents leading to crosslinking, it is also possible to use combinations of the different crosslinkable substituents on a fluorescent molecule. For example, a group such as an acrylate, crosslinkable by means of free radicals, may be present on a fluorescent molecule, in addition to a group capable of photocycloaddition, for example a cinnamic acid derivative.

In addition to the fluorescent compounds, the solutions for the production of the novel layers can, as stated above, also contain, for example, (thermal and photochemical) initiators, binders, reactive diluents, crosslinking agents and leveling agents, which are known to a person skilled in the art from coating technology.

The layers of the electroluminescent arrangement preferably contain at least one crosslinkable polymeric binder and/or at least one crosslinkable low molecular weight compound in addition to the charge-transporting and fluorescent compound.

Where the fluorescent compounds have no crosslinkable groups, ie. if they do not participate in network formation, the stated additives must perform the function of forming the insoluble network in which the fluorescent compounds are then fixed. The binders then used are advantageously polymers which are still soluble and carry crosslinkable pendent groups as stated above, ie. acrylates, methacrylates or maleic acid derivatives, vinyl ethers or epoxides or groups capable of photocycloaddition. An example of a polymer having pendent groups capable of photocycloaddition is poly[vinyl cinnamate].

For the production of the novel layers, the fluorescent compounds, with or without a cationic or free radical initiator, binder and reactive diluent, are advantageously dissolved in a solvent in which they are readily soluble and are applied, by means of a knife coater or a spin coater, to the substrate already coated with an electrode. After evaporation of the solvent, which may be accelerated, if required, by gentle heating, the resulting film is crosslinked by means of actinic radiation or by heating. The appropriate processes (for example UV curing, electron beam curing) are known from coating technology and have no special features; usually, wavelengths of from 200 to 450 nm are used in the case of UV radiation and energies of from 0.3 to 1 MeV in the case of electron beams. In the case of crosslinking effected by radiation, the layers can be directly structured, which is important, for example, for the production of displays. This is done, as a rule, similarly to the processes known from the resist technology.

The resulting, crosslinked layer is thermally stable and insoluble and has high mechanical strength. Depending on the desired form, further layers can be applied similarly or the second electrode can be applied immediately, for example by vapor deposition. Such EL arrangements have particularly good thermal stability.

EXAMPLE 4 g of vinylcarbazole, together with 0.1 g of the compound of the formula

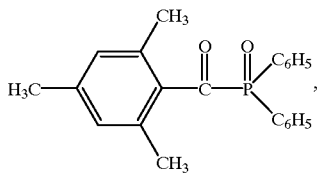

1.5 g of polyvinylcarbazole and 1.5 g of trimethylolpropane triacrylate, were dissolved in 200 ml of methoxypropanol. This solution was applied by means of a spin coater to a glass sheet coated with conductive ITO (indium tin oxide). This sheet was then heated at 90° C. for 3 minutes on a hot plate. The layer thickness after drying was 240 nm.

The layer obtained was then exposed to a high-pressure mercury lamp (HBO) for 10 minutes. This resulted in crosslinking. The layer was then insoluble in methoxypropanol.

An emitter layer was then applied to this layer. For this purpose, a solution of 0.01 g of the compound 19 and 0.99 g of poly[vinyl cinnamate] in 30 ml of toluene was applied by spin coating, dried, and crosslinked by exposure to an HBO lamp. The layer thickness was 190 nm.

The layers were then dried for one hour at 100° C. in a drying oven under reduced pressure.

An aluminum electrode was used as the top electrode. The aluminum was applied by vapor deposition in a conventional manner, and the layer thickness was 30 nm.

The electroluminescent arrangement produced in this manner fluoresces orange-red when a voltage of 91 V is applied.

We claim:

1. An electroluminescent arrangement containing one or more organic layers, at least one of which is obtained by thermal or radiation-induced crosslinking, and containing at least one charge-transporting compound or crosslinked charge-transporting compound derived from a charge-transporting compound which carries crosslinkable groups per layer, wherein in the electroluminescent arrangement one of the layers is completely or partially composed of a fluorescent compound derived from a crosslinkable fluorescent compound, and the compound emits fluorescent light in the wavelength range from 400 to 800 nm, and wherein the crosslinkable fluorescent compound originates from the group consisting of perylenes, naphthalimides, and benzotriazoles, and wherein the crosslinkable fluorescent compound contains groups capable of free radical, anionic or cationic crosslinking or capable of photocycloaddition, which are bonded to the fluorescent compound via spacers, wherein the spacers are selected from groups of the formula

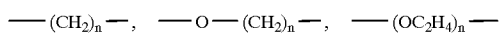

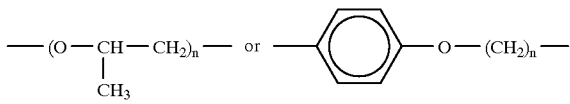

where n is from 1 to 12.

2. An electroluminescent arrangement as claimed in claim 1, wherein the layer or layers have a thickness of from 10 nm to 10 μm each.

3. An electroluminescent arrangement as claimed in claim 1, containing additionally a component derived from at least one crosslinkable polymeric binder and/or at least one crosslinkable low molecular weight compound.

4. An electroluminescent arrangement as claimed in claim 1, wherein one or more layers are obtained by crosslinking with UV radiation.

5. An electroluminescent arrangement as claimed in claim 1, wherein one or more layers are obtained by crosslinking with electron beams.

6. An electroluminescent arrangement as claimed in claim 1, wherein the crosslinkable fluorescent compound used is a compound having groups capable of free radical polymerization.

7. An electroluminescent arrangement as claimed in claim 6, wherein the crosslinkable fluorescent compound carries unsubstituted or substituted vinyl radicals as groups capable of free radical polymerization.

8. An electroluminescent arrangement as claimed in claim 1, wherein the groups capable of photocycloaddition are derived from the following structural units

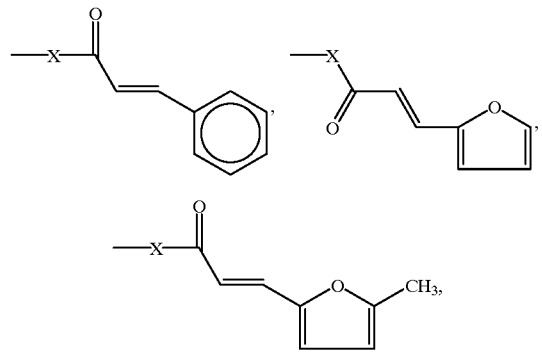

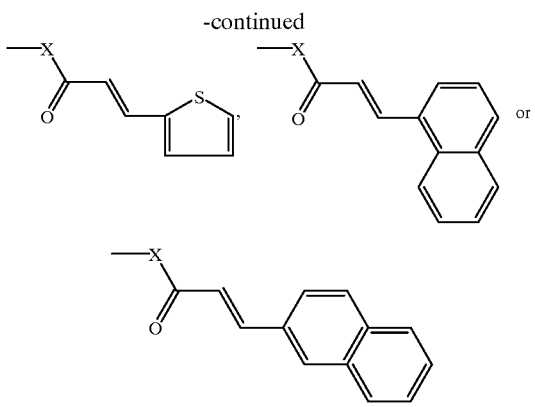

where X is O or NR and R is hydrogen or $C_1$–$C_6$-alkyl.

9. A process for the preparation of an electroluminescent arrangement as claimed in claim 1, wherein, in the production of the various organic layers, at least one layer, which, if desired, also contains the crosslinkable fluorescent compound, is obtained by applying a monomer solution, the solvent is then removed and the layer is then subjected to thermal or radiation-induced crosslinking.

10. An electroluminescent device comprising the electroluminescent arrangement of claim 1 arranged between two electrodes.

11. An electroluminescent arrangement containing one or more organic layers, at least one of which is obtained by thermal or radiation-induced crosslinking, and containing at least one charge-transporting compound or crosslinked charge-transporting compound derived from a charge-transporting compound which carries crosslinkable groups per layer, wherein in the electroluminescent arrangement one of the layers is completely or partially composed of a fluorescent compound derived from a crosslinkable fluorescent compound, and the compound emits fluorescent light in the wavelength range from 400 to 800 nm, and wherein the crosslinkable fluorescent compound originates from the group consisting of naphthalimides, and wherein the crosslinkable fluorescent compound contains groups capable of free radical, anionic or cationic crosslinking or capable of photocycloaddition, which are bonded to the fluorescent compound via spacers, wherein the spacers are selected from groups of the formula

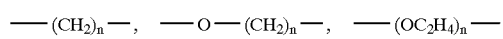

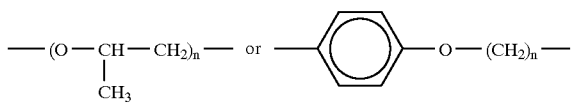

where n is from 1 to 12.

12. An electroluminescent device comprising the electroluminescent arrangement of claim 11 arranged between two electrodes.

* * * * *